United States Patent [19]

Sattin et al.

[11] Patent Number: 4,818,938
[45] Date of Patent: Apr. 4, 1989

[54] AUDIO CODED IMAGING

[75] Inventors: William Sattin, Cleveland Hts.; Eric E. Gatchalian, Willoughby, both of Ohio

[73] Assignee: Picker International, Inc., Highland Hts., Ohio

[21] Appl. No.: 160,913

[22] Filed: Feb. 26, 1988

[51] Int. Cl.$^4$ ............................................. G01R 33/20
[52] U.S. Cl. ...................................... 324/309; 358/93; 364/710.12; 250/653 S; 324/307; 128/660
[58] Field of Search .............. 250/363 S, 369; 358/93, 358/94; 364/710, 413–418; 324/300, 307, 309; 434/116; 128/660

[56] References Cited

U.S. PATENT DOCUMENTS

| | | | |
|---|---|---|---|
| 4,205,687 | 6/1980 | White et al. | 128/663 |
| 4,739,400 | 4/1988 | Veitch | 358/108 |
| 4,768,086 | 8/1988 | Paist | 358/81 |

OTHER PUBLICATIONS

"Monitoring Patients by Sounds of Music", USA Today Article, 8/20/87.
"Color Display of Quantitative Blood Flow and Cardiac Anatomy in a Single Magnetic Resonance Cine Loop", by Klipstein, et al., British Journal of Radiography, vol. 60, No. 710, 2/87, pp. 105–111.

Primary Examiner—Michael J. Tokar
Attorney, Agent, or Firm—Fay, Sharpe, Beall, Fagan, Minnich & McKee

[57] ABSTRACT

A scanner (A) generates electronic data which is indicative of characteristics of an interior region of a subject in an examination region. A computer generator (B) generates corresponding pixel values of first and second electronic image representations which are stored in first and second image memories (12, 22). A video processor 14 retrieves pixel values from one of the memories and converts them into a video signal for generating a visual display on a video monitor (16). An audio processor 24 retrieves values from the other image memory and utilizes them to control the frequencies and amplitudes or other characteristcs with which modulators (52, 54, 56, 58) modulate an audio icon signal. In this manner, the audio icon signal is modulated in accordance with the selected characteristics of the interior region. An electroacoustic transducer (66) converts the modulated audio signal into an audible display of the selected characteristic. The audio displayed selected characteristic might include flow rate, intensity, phase, relaxation values, diffusion coefficients, attenuation coefficients, acoustic impedance, flow velocities, photon counts, and a myriad of other parameters, both general and specific to the selected imaging modality.

19 Claims, 1 Drawing Sheet

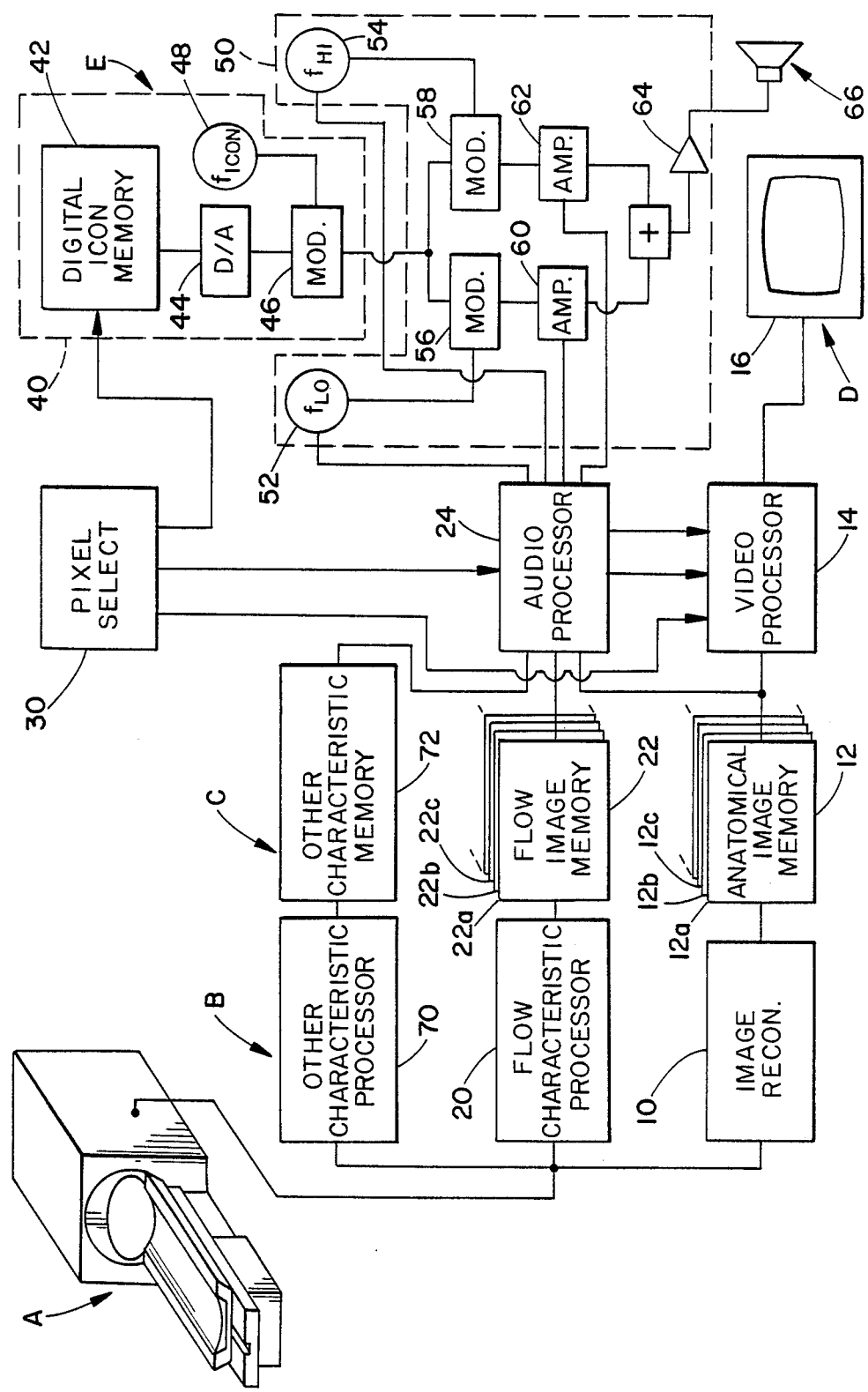

AUDIO CODED IMAGING

BACKGROUND OF THE INVENTION

The present invention relates to the art of diagnostic imaging. It finds application in conjunction with magnetic resonance imaging and will be described with particular reference thereto. However, it is to be appreciated that the invention may find further application in conjunction with other diagnostic imaging modalities such as computed x-ray tomography, positron emission tomography, ultrasound, digital x-ray, SPECT, and the like.

In medical diagnostic imaging, electronic image representations are generated and displayed as black and white images on a video monitor. Each pixel of the image has a gray scale which corresponds to a selected physical property of an examined object, such as tissue density, radiation absorption, and the like. Commonly, the displayed image represents a planar slice through the patient and the gray scale is selected to provide an image analogous to the appearance of such a slice if it could be physically taken. That is, the image has a readily apparent real life basis which simplifies understanding it.

The data used to generate the gray scale, anatomical image normally contains additional information which can be displayed directly or processed to derive further parameters corresponding to each of the displayed pixels. For example, a series of image representations of the heart can be collected each displaced in time. By displaying the images in sequence, a picture of the beating heart analogous to a moving picture can be created. The blood pumped by the heart has a gray scale which is not necessarily correlated to its velocity or direction of flow. In magnetic resonance imaging, the flow velocity of the blood moving through the heart can be determined with conventional algorithms. Traditionally, the flow velocity of the blood has been displayed by superimposing color on the black and white anatomical image. Each pixel was color coded in accordance with the flow direction, e.g. red for one direction and blue for the other. The intensity of the selected color was varied in accordance with the magnitude of the flow velocity. Analogously, other fundamental or derived parameters could be displayed by color coding.

One of the problems with the color coding technique is that it requires training to interpret. For example, blood or other flow rates in real life do not appear as different colors and color intensities. Rather, a radiologist must learn to translate the unnatural color variations into usable blood flow rate information.

Another problem with color coding is that it tends to overload the human visual channel. That is, in most imaging modalities there is so much information that could be displayed, video images cannot be color or otherwise coded sufficiently to convey all the information visually.

The color encoded video images not only required training to read, but also had limitations on accuracy. The human eye can only discern about 24 levels of gray scale and about 128 color hues. By contrast, the human ear can distinguish about 325 intensity levels and about 1800 frequency or pitch levels. Although the data was processed with a high degree of resolution or accuracy, the accuracy conveyed visually to the human observer was limited by limitations in the observer's powers of visual observation.

The present invention contemplates a new and improved imaging technique in which at least part of the available information is audio coded.

SUMMARY OF THE INVENTION

In accordance with one aspect of the present invention, a diagnostic method is provided. An electronic image representation indicative of characteristics of interior regions of an examined subject is computer generated. An audio signal is generated and coded in accordance with a selected one or more of the interior region characteristics.

In accordance with a more limited aspect of the present invention, a visible representation of at least one characteristic of the subject is presented concurrently.

In accordance with another aspect of the present invention, a diagnostic examination apparatus is provided. An examination means performs a non-invasive examination of a selected internal region of a subject and generates electrical data indicative of characteristics of the internal region. A computer generates at least one electronic image representation of the interior region characteristics. An audio signal generating means generates an audio signal. An audio signal coding means codes the audio signal in accordance with a selected interior region characteristic from the electronic image representation.

In accordance with a more limited aspect of the invention, a video processor is provided for creating a visually observable display of the same or different selected characteristics of the interior region on a video monitor.

One advantage of the present invention is that it enables more information to be transmitted than can be conveyed on a visual channel.

Another advantage is that information can be encoded in a more natural form. Preferably, the audio information is conveyed in audio wave forms which sound or are perceived by the human ear as varying in accordance with the sound of the selected characteristic. This natural encoding eliminates or reduces the amount of training necessary to determine the significance of the information.

Yet another advantage of the present invention is that the human ear can resolve a larger number of intensity or loudness levels than it can gray scale levels and a larger number of pitches than it can color hues. Still further advantages of the present invention will become apparent to those of ordinary skill in the art upon reading and understanding the following detailed description.

BRIEF DESCRIPTION OF THE DRAWINGS

The present invention may take form in various steps and arrangements of steps or in various components and arrangements of components. The drawings are only for purposes of illustrating a preferred embodiment and are not to be construed as limiting the invention.

The FIGURE is a diagrammatic illustration of a diagnostic imaging system in accordance with the present invention.

DETAILED DESCRIPTION OF THE PREFERRED EMBODIMENT

A scanner or examination means A non-invasively examines an interior slice or region of a patient or other object which is the subject of a diagnostic examination. The scanner generates electrical data signals which are indicative of characteristics of the interior region of the examined subject. A computer generating means B converts the electrical data signals into an electronic image representation indicative of the selected characteristics of the interior region. An image memory means C stores the image representation. Data from the image representations is retrieved and displayed concurrently on a video display means D and on an audio communication means E.

The examination means A in one preferred embodiment is a magnetic resonance scanner. It includes main magnetic field coils for generating a substantially uniform magnetic field longitudinally through an image region in which the subject is disposed. Gradient field coils apply gradient magnetic fields across the image region. A radio frequency transmitter means periodically applies radio frequency pulses for exciting and manipulating magnetic resonance. Magnetic resonance signals are received to produce the electrical data signals which are indicative of interior regions of the subject in the examination region. Data representative of selected characteristics are generated by selecting among a multiplicity of conventional imaging sequences.

In another preferred embodiment, the scanner A is a CT scanner. A source of penetrating radiation is rotated around the image region in which the subject is disposed. Radiation detectors are disposed across the examination region from the source of penetrating radiation to convert the intensity of received radiation and the location at which it was received into the electrical data signals. In other preferred embodiments, the scanner is a PET, ultrasound, digital x-ray, SPECT scanner or the like.

The computer generating or processor means B includes a reconstruction means 10 which reconstructs the received electrical data signals into a gray scale, anatomical image representation. The reconstruction means reconstructs the image in accordance with well-known algorithms selected in accordance with the type of scanner A selected. For example, for magnetic resonance imaging, the reconstruction means may perform a two dimensional Fourier transform. The reconstructed gray scale image representation is stored in a first or anatomical image memory means 12.

In an exemplary illustrated embodiment in which the image represents a planar region through the patient's heart, the scan is repeated at selected time increments to create a series of image representations which are stored in anatomical image memory portions 12a, 12b, 12c, etc. Each image represents the slice through the heart at a different point in the cardiac cycle.

A video display generating means or processor 14 retrieves the gray scale image information from the image memory means 12 and produces suitable video signals for display on a video monitor 16. More specifically to the illustrated embodiment, data corresponding to each time displaced image representation is displayed at analogous intervals on the video monitor. In this manner, a motion picture-like display of the beating heart is created. However, in a conventional magnetic resonance or computed tomography display, the flow velocity of the blood through the heart is not indicated on the display. Rather, the gray scale on the video display is the gray scale which is indicative of blood tissue. However, one cannot necessarily tell from the gray scale image whether the blood is flowing and if so, how fast or in what direction.

The computer generating means B further includes a second characteristic processing or computer means 20 for processing the electronic data signals to derive other diagnostic information concerning one or more selected characteristics of the scanned internal region. Various characteristics of the interior regions can be imaged such as intensity, phase, relaxation values, diffusion coefficients, attenuation coefficients, acoustic impedance, flow velocity, photo counts, and the like. For example, the processor may implement the a described in U.S. Pat. Nos. 4,683,431 or 4,689,560 flow velocity in each pixel. In the exemplary illustrated embodiment in which a slice through a patient's heart is imaged, the second characteristic processing means calculates a flow speed and a direction of the tissue corresponding to each pixel of the interior region or slice. A plurality of second characteristic image representations are generated at regular intervals as the heart beats. The pixel flow velocities in each time displaced image representation are stored in like pixel locations in a series of flow velocity memory portions 22a, 22b, 22c, etc., of a second or flow characteristic memory means 22.

An audio processor 24 preferably converts selected pixel values of the second characteristic image representation memory to appropriate control signals for the audio display means E. In the illustrated embodiment, the audio processor includes a separating means that determines whether the flow is in a positive or negative direction, where positive and negative may be arbitrarily chosen directions, could correspond to away from and towards the heart, or the like. Optionally, the pixel values indicative of flow in a positive direction are conveyed to the video processor which cause the corresponding pixels to be displayed in a red hue and pixel values indicative of flow in the opposite direction, cause the corresponding pixels to be displayed in a blue tone. The intensity with which the red and blue hues are displayed is controlled in accordance with the magnitude of the pixel values, i.e. the flow speed. Of course, other color combinations may be displayed.

A pixel selecting means 30 selects each pixel whose data value is to be audio coded. In the preferred embodiment, the video monitor D includes a touch sensitive screen for selecting the pixel. Alternately, a joystick type control can be utilized to select the pixel or group of pixels. Preferably, the joystick control is connected with the video processor 14 such that a corresponding cross hair, box, or other visible indicia or cursor is displayed on the video monitor to provide visual feedback regarding which pixel or group of pixels that are being displayed. The pixel selecting means is connected with the audio processor 24 such that it retrieves pixel values corresponding to the selected pixel.

The audio display means E includes an audio icon means 40 that provides a preselected audio icon signal. The audio icon is preferably a multifrequency signal which when converted to sound is perceived by the human observer as a natural sound for the selected information. For example, for blood flow, the audio icon may be a "whooshing" sound. The whooshing sound of the audio icon remains constant, but not static such that it resembles flowing liquid. The audio icon may be synthetically generated by trial and error or may be copied from a sound in nature. For example, a blood flow sound from a stethoscope may be recorded and digitized for use as the audio icon. Alternately, the icon may be produced by digitizing similar flow sounds, such as by digitizing the output of a microphone disposed adjacent a flexible or rubber hose with water flowing through it. Single tone or frequency icons may also be selected. However, single frequency icons tend to sound robotic and unnatural for human patients. Different icons may be selected for different countries to conform to cultural variations in auditory perception.

In the preferred embodiment, the audio icon means includes digital memory 42 for storing a plurality of digitized sounds, preferably one corresponding to each selectable characteristic. A digital to analog converter 44 converts the stored digital icon to an analog complex multi-frequency sound pattern. A sound adjusting means operates on the audio icon to render it more natural sounding. In the illustrated embodiment, the sound adjusting means is a frequency modulator 46 that combines the multi-frequency pattern with a modulating frequency from icon modulating frequency generator 48 to impart a natural rhythm.

An audio icon coding means 50 codes the audio icon signal in accordance with the selected characteristic, more specifically, in accordance with the retrieved pixel value. In the illustrated embodiment, the icon coding means includes a lower or first variable frequency generator 52 which produces a variable lower frequency output in a lower frequency range. A second or higher variable frequency generator 54 produces a higher frequency output in a higher frequency range. Preferably, the lower and higher frequency ranges are discontinuous such that there is a gap of unused frequencies therebetween. A lower or first frequency modulating means 56 modulates the audio icon with one of the frequencies from the lower frequency range and a higher or second frequency modulating means 58 modulates the audio icon with one of the frequencies from the higher frequency range. A lower frequency amplitude modulating means 60 adjusts the amplitude of the lower frequency modulated audio icon. A higher frequency modulating means 62 adjusts the amplitude of the higher frequency modulated audio icon. An amplifier 64 amplifies the combined output signal and applies it to a loud speaker or other electro-acoustic transducer 66.

The audio processor 24 retrieves the magnitude (speed) and sign (direction) of the selected pixels and controls the modulation frequencies and amplitudes accordingly. Various algorithms may be implemented which cause the pulsating sound to increase in frequency with increased flow speed and decrease in frequency with reduced speed. By way of example, the pixel value amplitude has one of 512 values. The lower frequency range is selected to include at least 512 frequency steps $f_1$ to $f_{512}$ and the higher frequency range is selected to include 512 frequency steps $f'_1$ to $f'_{512}$. Preferably, $f'_1$ is several steps higher than $f_{512}$. The amplitude modulating means can adjust the amplitude in 512 steps $A_1$ to $A_{512}$. Because the human ear is more sensitive to some frequencies than others, the amplitude steps are selected non-linearly such that each is perceived by the human ear as the same loudness. For a selected magnitude x with a sign indicating flow in the higher frequency direction, the audio icon I modulation is characterized by:

$$(I*f_{512-x})A_{512-x} + P(I*f'_x)A_x$$

That is, the icon signal is modulated by complimentary frequencies from the two frequency ranges and complimentary or inversely proportional amplitudes. Because the human ear perceives lower sounds as louder, one or both of the modulated signals is adjusted by a scaling factor P. The scaling factor is proportional to the perceived difference in loudness of the median frequencies of the two ranges. In this manner, at near zero flow speeds, neither frequency dominates. The dominant and secondary components are summed.

In this manner, as the flow rate becomes faster, the corresponding frequency of the dominant frequency range increases and becomes more dominate. As the flow rate becomes closer to zero, the degree of dominance diminishes. Adjacent a zero velocity, the first and second modulating frequencies have about the same intensity causing an interference which produces a "burbling" sound. In this manner, forward flow is modulated about a high frequency mean, backward flow is modulated about a low frequency mean, and velocity or flow near zero is represented by a non-specific intermediate frequency or sound.

Other algorithms may, of course, be selected for flow or to accommodate other displayed characteristics. For example:

$$I[(f_x*A_x) + P(f'_x*A_x)]$$

That is, the modulating signals are each amplitude modulated before frequency modulating the icon signal. The perception scaled modulating signals are combined and modulate the audio icon.

In operation, a series of scans are taken through a planar region that intersects the patient's heart. Each scan is displaced in time by a fraction of a second. The reconstruction means 10 reconstructs electronic signals into a corresponding series of image representations that are stored in memory 12. The second characteristic processor 20 concurrently processes the signals to produce a series of flow velocity signals that are stored in corresponding pixels of a flow velocity memory 22. The video processor 14 serially reads the image representations and displays them on the video monitor such that the monitor provides a display of the beating heart. The video processor may display the heart at actual speed or in slow motion. The operator with the pixel selection means 30 selects which pixel of the image that is to be reviewed. The audio processor 24 retrieves the flow data corresponding to the selected pixel or if a region of pixels are selected, retrieves and averages selected the flow data. The frequency and amplitude of the signals generated by the first and second variable frequency generators 52, 54 are modulated in accordance with the flow rate. By modulating the audio icon as described above, an audio display is produced which produces an audio sound analogous to a natural blood flow sound, which is indicative of blood flow velocity in the selected pixel or region. Optionally, a color representation of blood flow velocity may be superimposed on the image to provide both visual and audio indications of flow rate.

Additional characteristics can be audibly displayed concurrently or alternately. To this end, an other characteristics processor means 70 is provided for processing a selected one or more of the above referenced or other characteristics with conventionally available algorithms. The representations of the processed characteristics are stored in an appropriate other characteristic memory means 72. The other characteristic memory means 72 is connected with the audio processor 24 for providing appropriate output signals to the audio display means E. Other digital audio icons may be retrieved from the icon memory 42 to produce sounds which are appropriate to the selected characteristic. If the measured property only has a single range of interest rather than the two ranges or directions other icon modulating algorithm may be selected. For example, only a single one of the variable frequency means 52 may be used and the other disabled. In this manner, an audio display is produced which sounds natural to the selected characteristic is made.

As yet another option, the audio processor 24 may receive the output of the anatomical image memory 12 to provide a display of the same characteristic as the visual display but more accurately. An image is reconstructed representing a selected characteristic, such as tissue density, through a slice of the subject. The electronic image representation of the slice is stored in the memory 12 and displayed on the video monitor 16. The pixel selecting means concurrently selects a pixel to be audibly imaged and causes the video processor 14 to create an indicia or cursor on the video display in the corresponding location. The pixel selecting means is then moved along a selected track or path of the imaged slice. As the cursor moves from tissue type to tissue type, the audio display changes For example, the frequency may change as the cursor moves from bone tissue to soft tissue. Because the human ear can discern 1800 frequency steps between 20 and 20,000 hertz as opposed to 24 gray scales, tissue interfaces are more readily and accurately identified. Further, small variations in the tissue can be more readily identified audibly. For example, as the cursor moves through soft tissue, such as the liver, a readily noticeable change in frequency, pitch, volume, or the like occurs as the cursor hits even minute regions of a different tissue type. A noticeable audio change is achieved when the cursor moves through a region representing a tumor corresponding to the size of one pixel or less. A tumor too small to cause a perceptible gray scale shift may still produce a readily noticeable audio shift.

Numerous other variations can be made as are appropriate to the characteristic to be monitored. Different audio icons can be used ranging from simple audio wave forms to more complex wave forms. The icons may be tuned such that an irregularity such as a tumor produces a readily discernible off-key pitch. Mapping from the pixel value may modulate the icon in other manners. For example, the icon may be modulated with a single variable frequency, with a variable intensity fixed frequency, by varying beat patterns among two frequencies, by varying tone, intensity, or pitch of the icon, by selecting among different audio icons, stereo separation of audio signals, or the like.

The invention has been described with reference to the preferred embodiments. Obviously, alterations and modifications will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A magnetic resonance imaging apparatus for concurrently producing visual and audio indications of characteristics of an internal region of a subject, the apparatus comprising:
   a magnetic resonance scanner for causing and receiving magnetic resonance signals from the interior region;
   a reconstruction means for reconstructing a first image representation from the magnetic resonance signals;
   a first image memory means for storing a plurality of pixel values of the first image representation;
   a video processor means for converting the first image representation pixel values into video signals for producing a man-viewable display on a video monitor;
   a computer means for generating pixel values of a second image representation from one of the magnetic resonance signals and the first image representation pixel values;
   a second memory means for storing the second image representation pixel values;
   an audio processor for retrieving and processing selected pixel values from the second memory means;
   an audio icon means for generating an audio icon signal;
   an audio signal modulating means for modulating the audio icon signal in accordance with pixel values retrieved from the second memory means by the audio processor; and
   an electro-acoustic transducer for converting the modulated audio icon signals into an audio signal.

2. A diagnostic examination apparatus comprising:
   a computer generating means for generating pixel values of a first electronic image representation, which pixel values are indicative of characteristics of an interior region of an examined subject;
   an audio icon means for generating an audio icon signal; and,
   an audio modulating means for modulating the audio icon signal in accordance with the pixel values of the first image representation.

3. The apparatus as set forth in claim 2 wherein the audio icon means includes:
   an audio icon memory for storing a digital representation of at least one complex audio icon signal;
   a second modulating means for modulating the complex signal pattern with a selected frequency such that the audio icon signal is a frequency modulated complex signal pattern which approximates a natural sound.

4. The apparatus as set forth in claim 2 wherein the audio icon signal modulating means includes:
   a lower frequency generator for generating lower frequency signals in a variable low frequency range;
   a higher frequency generator for generating higher frequency signals in a variable higher frequency range;
   a lower frequency modulating means for modulating the audio icon signal with the lower frequency signals from a lower frequency generator;
   a higher frequency modulating means for modulating the icon signal with the higher frequency signals from the higher frequency generator;
   a combining means for combining the higher and lower frequency modulated signals in selectable ratios, the combining means being connected with an electro-acoustic transducer for supplying the modulated signal thereto.

5. The apparatus as set forth in claim 2 wherein the computer generating means includes a reconstruction means for reconstructing pixel values of a second image representation, which second image representation pixel values are indicative of characteristics of the interior region of the subject, corresponding first and second image representation pixel values being indicative of corresponding subregions of the interior region; and,
further including a video processor means for processing at least second image representation pixel values for producing video signals for producing a visual display of the second image representation on a video monitor.

6. The apparatus as set forth in claim .5 further including a pixel selecting means for selecting one or a small group of pixel values from the first image representation to be utilized for modulating the audio icon signal, whereby the audio signal is indicative of characteristics of a subregion of the displayed visual representation.

7. The apparatus as set forth in claim 6 wherein the pixel selecting means is operatively connected with the video processor for causing a visual indication of the selected pixel group.

8. A method of diagnostic examination comprising:
computer generating a first electronic image representation indicative of characteristics of an interior region of an examined subject;
determining variations in the image representation indicative of variations of a selected characteristic of the interior region;
generating an audio signal; and,
encoding the audio signal in accordance with the determined variations, whereby an audible display of the selected image characteristic is provided.

9. The method as set forth in claim 8 wherein the step of generating an audio signal includes retrieving a digital representation of a complex audio icon signal from memory to form the audio signal.

10. The method as set forth in claim 9 wherein the audio signal generating step further includes frequency modulating the generated audio signal, whereby a natural rhythm is imposed on the audio signal.

11. The method as set forth in claim 10 wherein the step of encoding the audio signal includes frequency modulating the audio signal, whereby the determined variations are represented by corresponding frequency shifts in the audio signal.

12. The method as set forth in claim 8 further including:
computer generating a second electronic image representation of the interior region of the subject, the second image representation being indicative of at least partially different characteristics of the interior region;
producing a visually observable display from the second image representation concurrently with the encoding of the audio signal, whereby visible and audible displays representing characteristics of the same interior region are concurrently produced.

13. The method as set forth in claim 12 wherein:
the computer generating steps include generating a series of first and second image representations respectively;
the visually displaying step includes serially displaying images from the series of second image representations to create a motion picture effect; and,
concurrently encoding the audio signal in accordance with the selected characteristic of the series of first image representations.

14. The method as set forth in claim 13 wherein the first series of image representations is indicative of flow rate and direction such that the encoded audio signal provides an audible indication of flow rate of a selected region of the visual image.

15. The method as set forth in claim 14 such that flow rate in one direction is encoded by modulating the audio signal with a lower frequency and flow rate in another direction is encoded by modulating the audio signal with a higher frequency.

16. The method as set forth in claim 8 further including displaying a visible image from the first electronic image representation such that the visible and audible displays of the selected characteristics are produced concurrently.

17. The method as set forth in claim 16 wherein the image representation includes data values corresponding to an array of pixels and wherein the visible image displaying step includes displaying an image representation of substantially all pixel values and the audio encoding step includes encoding the audio signal in accordance with values of selected pixels.

18. The method as set forth in claim 17 wherein the selected pixels are scanned serially.

19. The method as set forth in claim further including displaying a visible image and wherein the audible display corresponds to selected pixels of the visible image.

* * * * *